INVENTOR.
Albert W. Massman
BY Mueller & Aichele
Attys.

INVENTOR.
Albert W. Massman
BY
Mueller & Aichele
Attys.

3,344,355
Patented Sept. 26, 1967

3,344,355

DELAYED AUTOMATIC GAIN CONTROL FOR TRANSISTORIZED WAVE SIGNAL RECEIVERS

Albert W. Massman, Wheaton, Ill., assignor to Motorola, Inc., Franklin Park, Ill., a corporation of Illinois Filed Feb. 3, 1964, Ser. No. 341,994
8 Claims. (Cl. 325—405)

ABSTRACT OF THE DISCLOSURE

A gain control potential indicative of the level of the received signal is applied to the bias circuit of an IF amplifier transistor so that the gain thereof decreases substantially immediately with an increase in signal level. The potential is applied to the bias circuit of an RF amplifier transistor through a unilateral conductive device which is biased to preclude RF gain control until the received signal reaches a given level following which the device becomes conductive to reduce the gain of the RF transistor. Resistors in the bias circuits are proportioned to cause the RF gain to reduce faster than the IF gain once the given level is reached.

To insure a relatively constant output with varying incoming signal strength, it is common practice to provide an automatic gain control (AGC) circuit to control the gain of selected signal translating stages of a wave signal receiver such as a television receiver. The control signal is applied to the intermediate frequency (IF) stages of the receiver and often to the radio frequency (RF) stages of the receiver. However, in weak signal areas it is desirable to utilize the RF transistors at maximum gain with little or no AGC action for improved signal-to-noise ratio. On the other hand, without AGC action applied to the RF stages, the amplified signal in strong signal areas may be of sufficient magnitude to cause overloading and accompanying distortion in the IF stages of the receiver. Accordingly, it is desirable to provide an automatic gain control system wherein application of the gain control signal to the RF stages of the receiver is delayed until the incoming signal reaches a predetermined level. Further, to insure against overloading under extreme conditions, it is desirable that gain reduction of the RF stages occur at a greater rate than that of the IF stages once this predetermined signal level is reached.

Althuogh in the past range switches have been used so that uatomatic gain control could be applied only to the IF stages for fringe area reception and to both the RF and IF stages in strong signal areas, such schemes utilize additional costly circuit components, do not provide automatic adjustment for varying atmosphere conditions or for tuning the receiver between strong and weak channels, and have in the main proved less than satisfactory.

To eliminate the necessity of a range switch, numerous circuits have been proposed to provide delayed AGC in television receivers utilizing vacuum tubes in their RF and IF stages. But due to differences between transistors and vacuum tubes, such circuits are not applicable to receivers with transistorized RF and IF stages. For example, a vacuum tube is a high impedance device and accordingly gain control is achieved by varying grid potential by such means as providing a shunt path having a variable impedance between the grid of the tube and ground reference potential. In contrast, a transistor is a low impedance device so that gain control may be achieved by varying a current parameter such as base current. In addition, with vacuum tubes it is conventional to provide reverse AGC (i.e., driving the tube towards cutoff) in the presence of increased incoming signal strength. Transistors, on the other hand, may be subjected to either reverse or forward AGC (i.e., driving the transistor either towards cutoff or saturated conduction) in the presence of increasing incoming signal strength.

Forward AGC is uniquely adaptable to transistors and is often preferable in that it results in improved overload characteristics and in improved noise factor as compared to reverse AGC. It is known, for example, that many commercially available transistors, suitable for use in RF and IF amplifier stages, will experience reduced current gain with increasing base current once a point of maximum gain has been reached. There is an inherent gain reduction in such transistors and/or a drop in collector voltage across a dropping resistor in the collector circuit to result in reduced gain as the transistor is driven from the point of maximum gain towards saturated conduction. Thus, it is possible, in transistorized RF and IF stages, to achieve forward AGC by increasing base current beyond the point of maximum current gain, thus driving the transistor towards saturated conduction in the presence of high level signals.

It is therefore among the objects of the invention to provide an improved automatic gain control circuit arrangement for use in transistorized wave signal receivers which is simple to construct and inexpensive to manufacture.

Another object is to provide an automatic gain control system having control characteristics particularly suitable for use in transistorized television receivers.

A further object is to provide an automatic gain control circuit for use in transistorized television receivers in which the gain of the RF stages is reduced more rapidly than the IF stages subsequent to a predetermined delay for improved performance over a wide range of input signal levels.

A feature of the invention is the provision of an improved automatic gain control system for transistorized wave signal receivers in which a biased diode delays the application of gain controlling base current to the RF transistors therein, and in which the biasing arrangement for the RF and IF transistors allows the base current of the RF transistors to increase at a faster rate than the base current provided to the IF stages in the receiver subsequent to the delay.

Another feature is the provision of a biasing arrangement including a feedback loop for supplying base current to the RF and IF transistors of a transistorized television receiver, with base current increasing with incoming signal strength to drive the transistors towards saturated conduction for forward AGC action. A biased diode delays application of increased base current to the transistors of the RF stages until the incoming signal has reached a predetermined level, subsequent to which the biasing networks for the RF and IF transistors are arranged for forward AGC action such that base current for the RF transistors increases faster than base current applied to the IF transistors.

Other objects and features, as well as the attending advantages of the invention, will become apparent from the following description when taken in conjunction with the accompanying drawings, in which.

In summary, the AGC system of the invention, as incorporated in a transistorized television receiver, includes a feedback loop to control the gain of the transistors of the RF and IF stages in response to the level of the detected signal appearing in subsequent stages of the receiver. The feedback loop includes a gain control transistor to control base bias current for the RF and IF transistors, with the gain control transistor supplying forward AGC to the RF and IF transistors to drive them towards saturation conduction with increased received signal level.

The gain control transistor is connected directly to the base bias circuit arrangement for the IF transistors and to the base bias circuit arrangement of the RF transistors through a threshold device such as a biased semiconductor diode. The diode is reversed biased by the base bias circuit arrangement of the RF transistors so that base current of the RF transistors is not increased until the incoming signal level reaches a predetermined level. The base bias circuit arrangement for the RF transistors also allows base current in the RF transistors to increase at a faster rate subsequent to the delay period than the increase in base current for the IF transistors. Thus, at relatively low incoming signal levels AGC is applied only to the IF transistors and the RF transistors are biased for maximum gain, and at high signal levels AGC is applied to both the IF and the RF transistors, with the gain of the RF transistors decreasing at a faster rate. This allows maximum gain and a high signal-to-noise ratio in the RF transistor at low signal levels and prevents overload distortion in the IF stages at high signal levels so that the receiver may be operated under conditions of widely varying incoming signal levels.

Figures 1, 2:
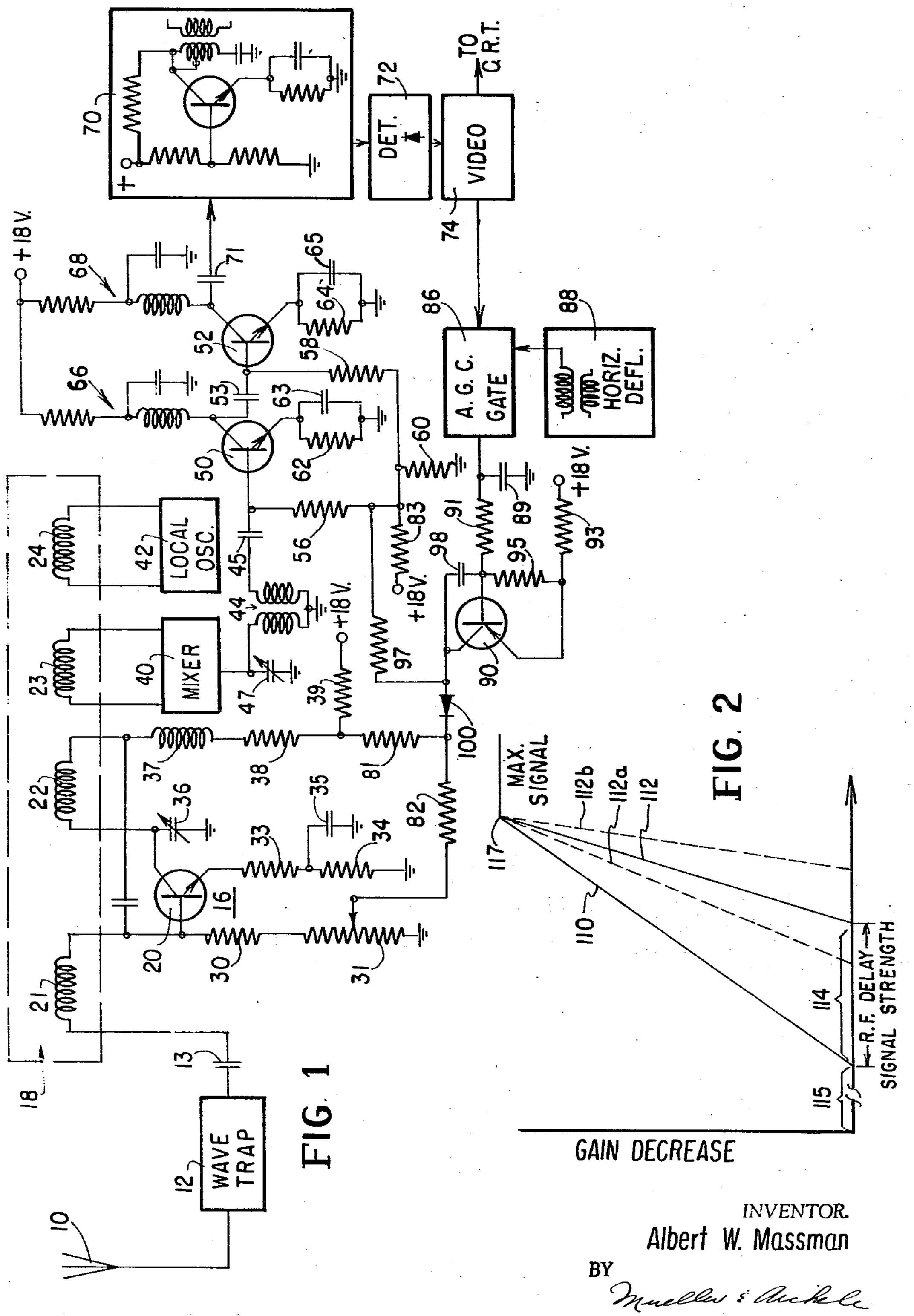
FIG. 1 is a schematic diagram of a portion of a transistorized television receiver embodying the invention.
FIG. 2 is a plot of curves illustrating the gain control action of the RF and IF stages of a television receiver achieved by the invention.

Referring now to FIG. 1, wherein the AGC system of the invention is shown in conjunction with a transistorized television receiver utilizing NPN radio frequency and intermediate frequency transistors, incoming carrier wave signals received at antenna 10 are coupled to wave trap 12 and then by capacitor 13 to the RF section of the receiver shown generally at 16. Wave trap 12 may include a number of frequency sensitive networks and the necessary balum transformers for matching the antenna with the RF section of the receiver.

Radio frequency section 16 includes a tuning section 18 and RF transistor 20. As is conventional practice tuning section 18 may include four sets of tuning coils 21, 22, 23 and 24, with only representative ones being shown, for tuning the input and output of the RF transistor 20, and for tuning of the mixer and the local oscillator of the superheterodyne television receiver. It is to be understood that in a practically constructed receiver tuning section 18 includes a plurality of coils represented by coils 21–24 that may be ganged for switching so that a desired TV channel may be selected.

Tuning coil 21 is coupled between capacitor 13 and the base electrode of RF transistor 20. A biasing network including resistors 30 and 31 is connected between the base electrode of RF transistor 20 and ground reference potential. Resistor 31 may be a potentiometer, as shown, or may be of a fixed value. The emitter electrode of RF transistor 20 is returned to ground reference potential through resistors 33 and 34. Resistor 33, relatively small value with respect to resistor 34, is unbypassed to provide some degeneration for RF transistor 20, while resistor 34 is bypassed by capacitor 35 for RF signals.

Output signals for RF transistor 20 are developed across tuning coil 22, one end of which is connected to the collector electrode of RF transistor 20. The collector electrode of RF transistor 20 is also returned to ground reference potential by variable capacitor 36 to provide fine tuning for the signals developed across coil 22. The other end of coil 22 is connected through RF choke 37 and resistors 38 and 39 to a source of positive potential or B+ to supply collector voltage for RF transistor 20. Typically the B+ for the receiver may be 18 volts, as indicated in FIG. 1.

Interaction between coils 22 and 23 couple the RF output of transistor 20 to the input of mixer 40. A second input for mixer 40 is derived from local oscillator 42, tuned by coil 24. The intermediate frequency (IF) signal derived from mixer 40 is coupled by intermediate frequency transformer 44 and capacitor 45 to the base electrode of first intermediate transistor 50. Transformer 44 may be tuned to the desired intermediate frequency by capacitor 47.

Transistor 50 and transistor 52 provide the gain controlled IF stages for the receiver. The output intermediate frequency signal appearing at the collector electrode of transistor 50 is coupled to the base electrode of transistor 52 by capacitor 53. A biasing network including resistors 56, 58 and 60 return the base electrodes of transistors 50 and 52 to ground reference potential. A DC return to ground reference potential for the emitter electrodes of transistors 50 and 52 is provided by resistors 62 and 64, suitably bypassed for intermediate frequency signals by capacitors 63 and 65. The collector electrodes of transistors 50 and 52 are connected to the B+ supply of the receiver through decoupling networks 66 and 68.

The intermediate frequency signal appearing at the collector electrode of transistor 52 is coupled by capacitor 71 to a further intermediate frequency stage 70. As is the usual practice, the output of IF stage 70 is sharply tuned and the stage is not gained controlled. The tuned output of IF stage 70 is supplied to video detector 72, with the detected composite video signal derived therefrom supplied to video amplifier stage 74 to be amplified to a level required for drive of the cathode ray tube of the receiver.

Base bias current is supplied to the NPN radio frequency transistor 20 by applying a positive voltage to the tap point of potentiometer 31 (or to the junction point between resistors 30 and 31 where a fixed resistor 31 is used) from the B+ supply of the receiver via dropping resistors 39, 81 and 82. This produces a voltage dividing action to supply a slightly positive voltage through resistor 30 to the base electrode of RF transistor 20 to provide forward bias for its base-emitter diode. There is, accordingly, a DC current path through resistor 30 and base-emitter diode of transistor 20 and back to ground reference potential through resistors 33 and 34. This provides base current bias to establish the gain of RF transistor 20 at a maximum level in the absence of a gain control signal.

Base current bias is supplied to the NPN intermediate frequency transistors 50 and 52 by applying a positive voltage to the junction points between resistors 56, 58 and 60 from the B+ supply of the receiver via dropping resistor 83. This produces a voltage dividing action to supply a slightly positive voltage to the base electrodes of the IF transistors 50 and 52 through resistors 56 and 58 to provide a forward bias for their base-emitter diodes. There is, accordingly, a DC current path through resistor 56 and base-emitter diode of transistor 50 and back to ground reference potential through resistor 62, and a similar path through resistor 58 and the base-emitter diode of transistor 52 and back to ground reference potential through resistor 64. This provides a base current bias to establish the gain of IF transistors 50 and 52 at a maximum level in the absence of a gain control signal.

To provide gain control action the output video amplifier stage 74 is sampled and supplied to AGC gate 86. This output is the detected composite video signal and includes horizontal synchronizing pulses having maximum excursion exceeding the video portion of the detected signal. As is known practice, AGC gate 86 is keyed or gated at horizontal frequency by pulses derived from the high voltage transformer of horizontal deflection and high voltage system 88. Accordingly, there is developed at the output of AGC gate 86, across filtering capacitor 89, a DC control signal proportional to the level of the horizontal synchronizing pulses of the detected composite video signal. This DC control signal is in turn supplied through resistor 91 to the base electrode of AGC transistor 90.

The PNP transistor 90 has its emitter electrode connected to the B+ source of the receiver through dropping resistor 93, and its base electrode connected to its emitter electrode by resistor 95. The arrangement maintains the base electrode of transistor 90 sufficiently positive with respect to its emitter electrode so that it is normally nonconductive or cutoff. The collector electrode of transistor 90 is returned to the B+ source of the receiver through dropping resistors 97 and 83. Because of the voltage division provided by resistor 60, the voltage supplied to the collector of transistor 90 is less positive than that supplied to its emitter electrode through dropping resistor 93. Capacitor 98 is connected between the base and the collector electrodes of transistor 90 for added filtering of the control signal applied to its base electrode. This arrangement provides negative feedback or a Miller integrator so that there is large effective filtering capacitance at high signal levels and less effective filtering capacitance at lower signal levels appearing at the output of AGC gate 86. Thus, a minimum effective RC time constant that is rapidly responsive to the output of AGC gate 86 is maintained at different signal levels.

The amplified and filtered control signal appearing at the collector electrode of AGC transistor 90 is supplied directly to the junction point between resistors 56, 58 and 60 of IF transistors 50 and 52 by dropping resistor 97. The collector electrode of transistor 90 is also coupled to the junction point of resistors 81 and 82 by diode 100. Diode 100 is poled to be conductive in the presence of an increasing DC level appearing at the collector electrode of transistor 90. In addition, diode 100 receives a reverse biasing voltage from the B+ supply of the receiver appearing at the junction point of resistors 81 and 82. Because of the voltage division action provided by potentiometer 31, the magnitude of the reverse bias for diode 100 can be varying by adjusting the tap point on potentiometer 31 (or alternately by changing the value of resistor 31 where a fixed resistor is used). The reverse bias for diode 100 exceeds the DC voltage level appearing at the collector electrode of transistor 90 in the absence of an output from AGC gate 86, that is, when there is no incoming signal for the receiver.

For the PNP transistor shown for AGC transistor 90, AGC gate 86 is adapted to supply a control voltage to the base electrode of transistor 90 which decreases with incoming signal level. This may be achieved, for example, by coupling a transistor in shunt with capacitor 89 and biased to become increasingly conductive for higher incoming signal levels, thereby bleeding off the control voltage developed across capacitor 89.

Since, as noted, the emitter electrode of transistor 90 is maintained more positive than its collector electrode, increased conduction resulting from a decreasing positive voltage applied to its base electrode causes the voltage appearing at its collector electrode to approach that of its emitter electrode. This, in turn, applies a positive going voltage to the junction point of resistors 56, 58 and 60 in the presence of an increased detected composite video signal supplied to the AGC gate 86. Accordingly, the forward bias of the base-emitter diodes of transistors 50 and 52 is increased and they draw more base current to be driven towards saturated conduction. This results in forward AGC action. At the same time, and for a DC voltage level appearing at the collector electrode of transistor 90 less than the reverse bias applied to diode 100, the base bias current for RF transistor 20 remains unchanged. When its reverse bias is exceeded, diode 100 conducts and the junction point of resistors 81 and 82 and hence the forward bias for the base-emitter diode of RF transistor 20, as supplied through resistor 30, is increased. There is, accordingly, increased base current so that RF transistor 20 is driven towards saturated conduction for forward AGC action.

The emitter resistors for transistors 20, 50 and 52 provide degeneration for DC emitter current which effects changes in current gain for a given change in base bias current. For example, decreasing the emitter resistor for a given collector voltage results in a faster decrease in current gain as base bias current increases, and by selecting relative values of emitter resistors for RF transistors 20 and IF transistors 50 and 52, the rate at which forward AGC action takes place can be made different in the RF and IF stages of the receiver. Thus, subsequent to the delay provided by diode 100, the gain reduction of RF transistor 20 occurs faster than, and overtakes the gain reduction of IF transistors 50 and 52.

With particular reference now to FIG. 2, wherein there is shown a plot of current gain decrease versus incoming signal strength, curve 110 represents the gain control of IF transistors 50 and 52, and curve 112 represents the gain control of RF transistor 20. The current gain of IF transistors 50 and 52 decreases gradually in response to the output of control transistor 90. The current gain of RF transistor 20 remains constant for a predetermined range as a result of the delay provided by diode 100, as shown by reference numeral 114. Subsequent to this delay current gain of RF transistor 20 decreases at a more rapid rate than the decrease in current gain of IF transistors 50 and 52, as shown by curve 112. The range of delay may be varied by varying the reverse bias for diode 100, while the subsequent rate of decrease in current gain of RF transistor 20 may be varied by changing the value of its emitter resistor, as illustrated by curves **112*a* and 112*b***.

There is, in addition, an initial range of incoming signal strength, indicated by numeral 115, over which there is no gain reduction in either the RF or the IF transistors. This range occurs at low level signals which are insufficient in amplitude to bias AGC gate 86 into conduction to change the charge on capacitor 89, and may be termed IF delay. It may also be seen from FIG. 2 that the cross-over point 117 for the gain reduction of the IF and RF transistors occurs at the point of maximum signal strength the receiver is designed to handle. At all times prior to cross-over point 117 the RF gain decreases faster than the IF gain so that there is no overload of the IF transistors until maximum signal handling capacity of the receiver has been reached.

Figures 3, 4:
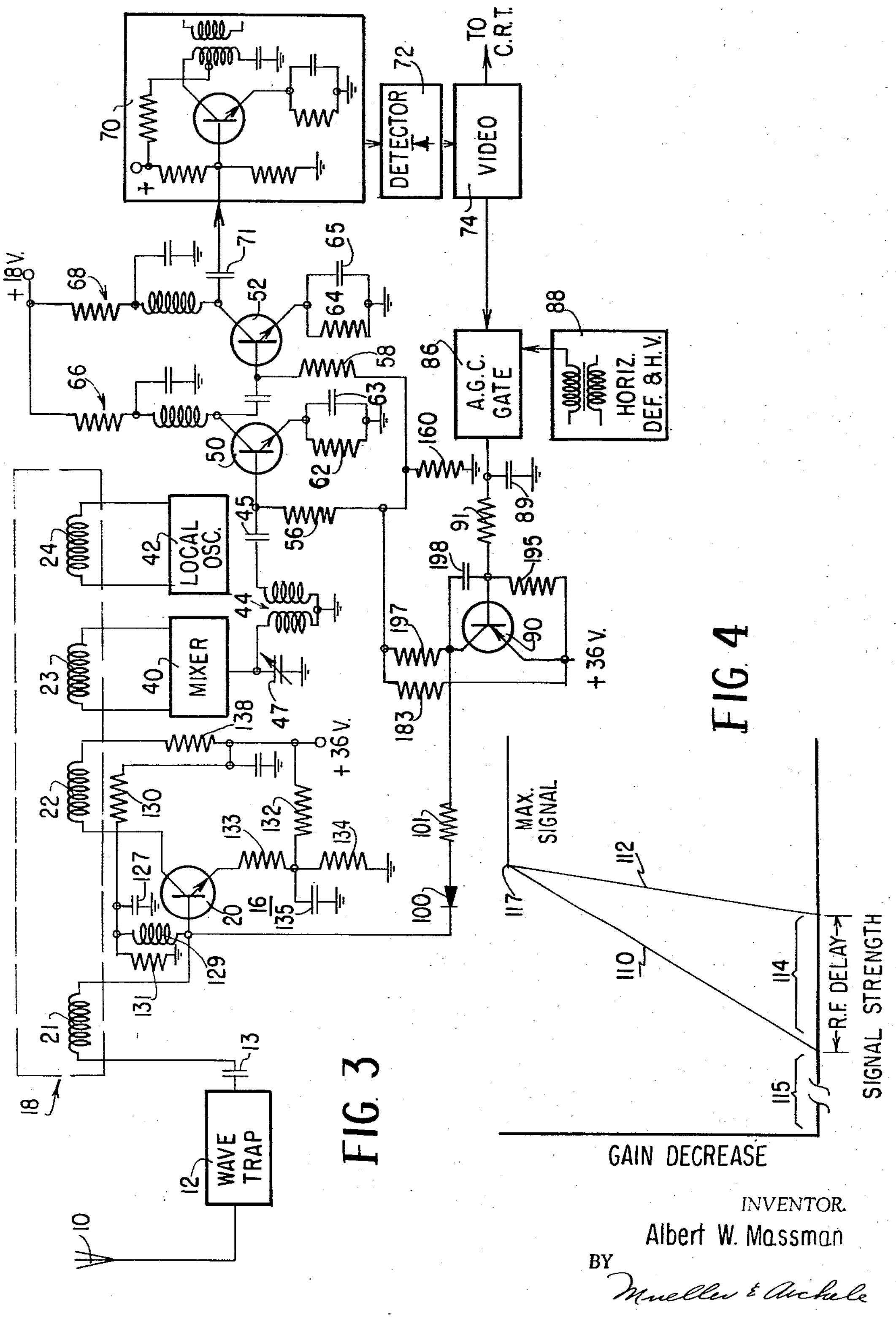
FIG. 3 is a schematic diagram of a further embodiment of the invention.
FIG. 4 is a further plot of the gain control action of the RF and IF stages.

A further embodiment, adapted to allow faster reduction of RF gain subsequent to the RF delay interval, is shown in FIG. 3, wherein like reference numerals refer to like circuit elements as in FIG. 1. It is to be noted that in FIG. 1 the voltage dividing action of potentiometer 31 reduces the effective gain control signal applied through resistor 30 to the base electrode of RF transistor 20. Thus, for example, for every volt change in the gain control signal appearing at the collector electrode of AGC transistor 90, and producing gain reduction in IF resistors 50 and 52, there is effectively less than a volt change in the signal producing gain reduction in RF transistor 20. The embodiment of FIG. 3 provides a greater change in forward bias of transistor 20 for a given increase in the gain control signal and is particularly adaptable for use with receivers having a higher available operating voltage as, for example, a 36-volt B++ supply as distinguished from the 18 volt B+ supply for a receiver of the embodiment of FIG. 1.

In FIG. 3 diode 100 is directly connected between the collector electrode of gain control transistor 90 and the base electrode of RF transistor 20. B++ voltage (36 volts) is applied to the collector electrode of transistor 20 through resistor 138 and tuning coil 22. Voltage dividing arrangements including resistors 130 and 131 and resistors 132 and 134, respectively, supply emitter and base voltages for transistor 20 from B++. The junction point between resistors 130 and 131 is bypassed by capacitor 127 and is connected by choke 129 to the base electrode of transistor 20. The junction point between resistors 132 and 134 is bypassed by capacitor 135 and connected to the emitter electrode of transistor 20 by resistor 133. Resistor 133, relatively small with respect to resistor 134, is unbypassed to provide some degeneration for transistor 20.

By making resistors 132 and 134 equal in value, one-half of the B++ voltage (or 18 volts) is applied to emitter electrode of transistor 20. A similar ratio between resistors 130 and 131, but with resistor 131 slightly larger, maintains the base electrode of transistor 20 slightly positive with respect to its emitter electrode to provide base current bias for transistor 20. The ratio between resistors 130 and 131 establish maximum gain for transistor 20 in the absence of a gain control signal.

The collector electrode of transistors 50 and 52 is connected to B+ (18 volts) through decoupling networks 66 and 68, and their emitter electrode return to ground reference potential through resistors 61 and 62 (suitably bypassed by capacitors 63 and 65) in the same manner as in the embodiment of FIG. 1. Resistors 183 and 160 are connected between B++ and ground reference potential, and form a voltage divider having its junction point connected to resistors 56 and 58 for supplying base current bias to IF transistors 50 and 52. This establishes maximum gain for transistors 50 and 52 in the absence of a gain control signal.

The PNP transistor 90 has its emitter electrode connected to B++ and its base electrode to its emitter by resistor 195 to maintain its base electrode sufficiently positive with respect to its emitter electrode so that it is normally non-conducting or cutoff. As in the embodiment of FIG. 1, the voltage developed across capacitor 89 and supplied to the base electrode of transistor 90 decreases with increasing incoming signal level, thus rendering transistor 90 more conductive. As transistor 90 becomes increasingly conductive, the voltage appearing at its collector electrode tends to rise towards B++ (36 volts).

The collector electrode of transistor 90 is connected to the junction of resistors 56, 58 and 60 by resistor 197, thus making this point more positive with increasing incoming signal strength. Accordingly, the forward bias of the base-emitter diode of transistors 50 and 52 is increased and they draw more base current to drive them towards saturated conduction for forward AGC action.

The collector electrode of transistor 90 is connected to the anode electrode of diode 100 by resistor 101. The cathode electrode of diode 100 is in turn connected to the base electrode of transistor 20. The voltage at the collector electrode of transistor 90 is initially less than the reverse bias applied to diode 100, which reverse bias is derived from the base electrode of transistor 20. When this reverse bias is exceeded diode 100 conducts to supply increasing forward base-emitter bias for transistor 20, resulting in increased base current and forward AGC action.

It is to be noted that the increased base current for forward AGC action is supplied to transistors 50 and 52 through resistor 197, and to transistor 20 through diode 100 and resistor 101. The voltage drop across these two resistors limits the rate at which the base current for the respective transistors is increased for a given voltage increase at the collector electrode of transistor 90. By making the resistor 101 small with respect to resistor 197, AGC of transistor 20 occurs at a faster rate than AGC of transistors 50 and 52 subsequent to the delay provided by diode 100. However, since the reverse bias for diode 100 is established by a voltage divider, the relative change of base current for transistor 20 is greater for a given voltage change at the output of collector electrode of transistor 90 than in the embodiment of FIG. 1.

The resulting decrease in gain with increasing incoming signal strength is shown in FIG. 4, wherein like reference numerals refer to like curves as in FIG. 2. It is to be noted that the gain reduction curves are similar to those of FIG. 2, but with the possibility of a faster decrease in RF gain subsequent to delay by virtue of the fact that there is a high correspondence of base current increase for a given increase in the AGC signal derived from transistor 90 than with the embodiment of FIG. 1.

It should be apparent to those skilled in the art that the above described invention may be employed with equal facility with receivers utilizing PNP transistors in the RF and IF stages. For example, although not limiting, the collector electrodes of the gain controlled PNP stages may be returned to ground reference potential, with a positive operating potential applied to their emitter electrodes. Quiescent base current bias is then established by maintaining their base electrodes slightly less positive with respect to their emitter electrodes. Under these conditions control transistor 90 may be an NPN transistor, initially biased for non-conduction and its emitter electrode returned to ground reference potential. With the polarity of diode 100 reversed, and with a control signal derived from AGC gate 86 adapted to increase conduction in transistor 90, delayed forward AGC action in the manner described may be achieved.

As a result of the foregoing, the transistor of the RF stage of the receiver may be provided with maximum gain under low signal conditions, with AGC applied to the transistors of the IF stages only. With an increased received signal level, AGC is automatically applied to both the RF and IF stages, with the gain of the RF stages being reduced at a more rapid rate to prevent overload and distortion in the IF stages. Thus, the invention provides an improved AGC system particularly suitable for transistorized television receivers, which system produces effective gain control over a wide range of received signal levels.

I claim:

1. In a superheterodyne television receiver for television signals, the combination of a radio frequency amplifier stage having first transistor means, first bias circuit means including first resistor means for applying base current bias to said first transistor means to establish the gain thereof, said first bias circuit means adapted to receive a gain control signal for decreasing the gain of said first transistor means at a first rate with increasing received signal strength, an intermediate frequency amplifier stage having second transistor means, second bias circuit means including second resistor means for applying base current bias to said second transistor means to establish the gain thereof, said second bias circuit means adapted to receive a gain control signal for reducing the gain of said second transistor means at a second rate with increasing received signal strength, detector means coupled with said intermediate frequency amplifier stage for demodulating the received television signal, a gain control feedback loop having an input coupled to said detector means and an output providing a gain control signal representing the level of the received television signal, first circuit means connecting the output of said gain control feedback loop to said second bias circuit means, second circuit means including a unidirectional conductive device coupling the output of said gain control feedback loop to said first bias circuit means, and third circuit means applying reverse bias to said unidirectional conductive device to delay the application of said gain control signal to said first bias circuit means until the received television signal reaches a predetermined level, said first and second resistor means being proportioned to cause the gain of said radio frequency amplifier stage to be reduced at a faster rate than the gain of said intermediate frequency amplifier stage when the received television signal exceeds the predetermined level.

2. In a superheterodyne receiver for wave signals, the combination of a radio frequency amplifier stage including first transistor means having emitter, collector and base electrodes, first bias circuit means for supplying base current bias to said first transistor means to establish the gain thereof at a predetermined level, said first bias circuit means adapted to increase base current to thereby reduce the gain of said first transistor means from said predetermined level at a first rate in response to a gain control signal applied thereto, an intermediate frequency amplifier stage including second transistor means having emitter, collector and base electrodes, second bias circuit means for supplying base current bias to said second transistor means to thereby establish the gain thereof at a predetermined level, said second bias circuit means adapted to increase the base current to thereby reduce the gain of said second transistor means from said predetermined level at a second rate in response to a gain control signal applied thereto, detector means coupled with said intermediate frequency amplifier stage for demodulating the received signal, a gain control transistor having an input coupled with said detector means and an output providing a gain control signal representing the level of the demodulated received signal, means connecting the output of said gain control transistor to said second bias circuit means, and circuit means including a unidirectional conductive semiconductor device connected between the output of said gain control transistor and said first bias circuit means, means supplying a reverse bias to said semiconductor device, whereby gain reduction of said radio frequency amplifier stage is delayed until said gain control signal exceeds the reverse bias of said semiconductor device, subsequent to which the gain of said radio frequency stage is reduced at a faster rate than the gain of said intermediate frequency stage.

3. In a superheterodyne television receiver for a television signal, the combination of a radio frequency amplifier stage including first transistor means having emitter, collector and base electrodes, first bias circuit means for applying base current bias to said first transistor means to establish the gain thereof, said first bias circuit means including a voltage dividing network connected between the base electrode of said first transistor means and a bias voltage source, and a current limiting resistor connected in series with the emitter electrode of said first transistor means, said first bias circuit means adapted to receive a gain control signal and to increase base current to reduce the gain of said first transistor means at a first rate in response to increasing received signal strength, an intermediate frequency amplifier stage including second transistor means having emitter, collector and base electrodes, a second bias circuit means for applying base current bias to said second transistor means to establish the gain thereof, said second bias circuit means including a voltage dividing network connected between the base electrode of said second transistor means and a bias voltage source, and a current limiting resistor connected in series with the emitter electrode of said second transistor means, said second bias circuit means adapted to receive a gain control signal and to increase base current to reduce the gain of said second transistor means at a second rate in response to increasing received signal strength, detector means coupled with said intermediate frequency amplifier stage for demodulating the received signal, a gain control transistor having an input coupled with said detector means and an output providing a gain control signal indicative of the level of received signal strength, resistor means connecting the output of said gain control transistor to the voltage dividing network of said second bias circuit means, and a semiconductor diode connected between the output of said gain control transistor and the voltage dividing network of said first bias circuit means, said first bias circuit means providing a reverse bias for said diode, whereby gain reduction of said radio frequency amplifier stage is delayed until said gain control signal exceeds the reverse bias of said diode, subsequent to which the gain of said radio frequency amplifier stage is reduced at a more rapid rate than gain reduction of said intermediate frequency amplifier stage in the presence of increased received signal strength.

4. In a receiver for wave signals, the combination of a first amplifier stage including first transistor means having emitter, collector and base electrodes, first bias circuit means for applying base current bias to said first transistor means to establish the gain thereof at a predetermined level, said first bias circuit means including a resistive voltage dividing network connected between the base electrode of said first transistor means and first and second potentials, and a current limiting resistor connected between the emitter electrode of said first transistor means and one of said first and second potentials, said first bias circuit means adapted to increase base current in response to a control signal applied thereto to reduce the gain of said first transistor means from said predetermined level at a first rate for increasing received signal strength, a second amplifying stage including second transistor means having emitter, collector and base electrodes, second bias circuit means for applying a base current bias to said second transistor means to establish the gain thereof at a predetermined level, said second bias circuit means including a resistive voltage dividing network connected between the base electrode of said second transistor means and first and second potentials, and a current limiting resistor connected between the emitter electrode of said second transistor means and one of said first and second potentials, said second bias circuit means adapted to increase the base current in response to a gain control signal applied thereto to reduce the gain of said second transistor means from said predetermined level at a second rate for increasing received signal strength, detector means coupled with said second amplifier stage for demodulating the received signal, a gain control transistor having an input coupled with said detector means and an output providing a gain control signal representing received signal strength, resistance means connecting the output of said gain control transistor to the voltage dividing network of said second bias circuit means, and a semiconductor diode connected between the output of said gain control transistor and a tap point on the voltage dividing network of said first bias circuit means, said tap point providing a reverse bias for said diode, whereby gain reduction of said first amplifier stage is delayed until said gain control signal exceeds the reverse bias of said diode, subsequent to which the gain of said first amplifier stage is reduced at a more rapid rate than the gain of said second amplifier stage in the presence of increased received signal strength.

5. In a superheterodyne television receiver for a television signal, the combination of a radio frequency amplifier stage including first transistor means having emitter, collector and base electrodes, first bias circuit means for applying base current bias to said first transistor means to establish the gain thereof, said first bias circuit means including a voltage dividing network connected between the base electrode of said first transistor means and a voltage source, with said first bias circuit means adapted to receive a gain control signal and to increase base current to reduce the gain of said first transistor means in response to increased received signal strength, an intermediate frequency amplifier stage including second transistor means having emitter, collector and base electrodes, second bias circuit means for applying base current bias to said second transistor means to establish the gain thereof, said second bias circuit means including a voltage dividing network connected between the base electrode of said second transistor means and a voltage source, with said second bias circuit means adapted to receive a gain control signal and to increase base current to reduce the gain of said second transistor means in response to increased received signal strength, detector means coupled with said intermediate frequency amplifier stage for demodulating the received signal, a gain control transistor having an input coupled with said detector means and an output providing a gain control signal indicative of the level of received signal strength, first resistance means connecting the output of said gain control transistor to the voltage dividing network of said second bias circuit means, and the series combination of second resistor means and a semiconductor diode connecting the output of said gain control transistor to the voltage dividing network of said first bias circuit means, with said first voltage dividing network providing a reverse bias for said diode, and with said first and second resistors providing an increase in base current bias for said first and second transistor means at different rates as the output of said gain control transistor exceeds the reverse bias of said diode.

6. In a superheterodyne receiver for television signals, the combination of a radio frequency amplifier stage including first transistor means having emitter, collector and base electrodes, means for applying a direct current voltage of a first level to the collector electrode of said first transistor means, first voltage dividing means for applying a direct current voltage of a second level to the emitter electrode of said first transistor means to thereby provide a collector-emitter operating voltage for said first transistor means, second voltage dividing means connected to the base electrode of said first transistor means to supply base current bias thereto, said second voltage dividing network adapted to receive a gain control signal and to increase base current to reduce the gain of said first transistor means in response to increased received signal strength, an intermediate frequency amplifier stage including second transistor means, circuit means for applying a direct current voltage of said second level to the collector electrode of said second transistor means, by-passed resistance means returning the emitter electrode of said second transistor means to ground reference potential, bias circuit means including a third voltage dividing network connected to the base electrode of said second transistor means to supply base current bias to said second transistor means, said bias circuit means adapted to increase base current of said second transistor means in response to increased incoming signal strength, detector means coupled with said intermediate frequency amplifier stage for demodulating the received signal, a gain control transistor having an input coupled with said detector means and an output providing a gain control signal indicative of the level of received signal strength, said gain control signal rising with increased signal strength, a first resistor connected between the output of said gain control transistor and said third voltage dividing network, and a second resistor and a semiconductor diode connected in series between the output of said gain control transistor and the base electrode of said first transistor means, with said second voltage dividing network providing a reverse bias for said diode, and with said first and second resistors providing an increase in base current bias for said first and second transistor means at different rates as the output of said gain control transistor exceeds the reverse bias of said diode.

7. In a superheterodyne receiver for television signals, the combination of, a radio frequency amplifier stage including first transistor means having emitter, collector and base electrodes, first bias circuit means coupled to said first transsitor means for supplying base current bias thereto to establish the gain thereof at a first predetermined level, said first bias circuit means being responsive to a gain control signal applied thereto to increase the base current bias in said first transistor means to reduce the gain thereof from said first predetermined level, an intermediate frequency amplifier stage including second transistor means having emitter, collector and base electrodes, second bias circuit means coupled to said second transistor means for supplying base current thereto to establish the gain thereof at a second predetermined level, said second bias circuit means being responsive to a gain control signal applied thereto to increase the base current bias in said second transistor means to reduce the gain thereof from said second predetermined level, detector means coupled to said intermediate frequency amplifier stage for demodulating the television signals, a gain control gate having an input coupled to said detector means and an output providing a gain control signal representing the level of the television signals, a gain control amplifier transistor having an input electrode coupled to the output of said gate, said amplifier transistor having an output electrode, capacitor means coupled between the input and output electrodes of said amplifier transistor for filtering the gain control signal, means coupling the output electrode of said amplifier transistor to said second bias circuit means to reduce the gain of said second transistor means when said gain control signal reaches a first level, means including a unidirectional conductive semiconductor device coupled from the output electrode of said amplifier transistor to said first bias circuit means, and means supplying a bias voltage to cut off said semiconductor device until the control signal exceeds a second level which is greater than said first level, whereby gain reduction of said radio frequency amplifier stage is delayed from gain reduction of said intermediate frequency amplifier stage.

8. The receiver set forth in claim 7 wherein said means supplying a bias voltage includes a potentiometer having a tap coupled to said unidirectional conductive semiconductor device for adjusting the magnitude of the bias voltage thereon.

References Cited

UNITED STATES PATENTS

| | | | |
|---|---|---|---|
| 2,135,561 | 11/1938 | Connell | 325—405 X |
| 3,192,316 | 6/1965 | Humphrey | 325—404 X |
| 3,193,767 | 7/1965 | Schultz | 325—414 X |
| 3,205,444 | 9/1965 | Birkenes | 325—404 |

KATHLEEN H. CLAFFY, *Primary Examiner.*

R. LINN, *Assistant Examiner.*